(12) United States Patent
Fukuda et al.

(10) Patent No.: US 9,947,857 B2
(45) Date of Patent: Apr. 17, 2018

(54) POLYMERIC ACTUATOR

(71) Applicant: TOYO TIRE & RUBBER CO., LTD., Osaka-shi, Osaka (JP)

(72) Inventors: Takeshi Fukuda, Osaka (JP); Aya Ito, Osaka (JP); Hiroyuki Anzai, Osaka (JP); Zhiwei Luo, Hyogo (JP)

(73) Assignee: TOYO TIRE & RUBBER CO., LTD., Itami-shi (JP)

( * ) Notice: Subject to any disclaimer, the term of this patent is extended or adjusted under 35 U.S.C. 154(b) by 387 days.

(21) Appl. No.: 14/653,128

(22) PCT Filed: Dec. 6, 2013

(86) PCT No.: PCT/JP2013/082831
§ 371 (c)(1),
(2) Date: Jun. 17, 2015

(87) PCT Pub. No.: WO2014/112241
PCT Pub. Date: Jul. 24, 2014

(65) Prior Publication Data
US 2015/0325779 A1    Nov. 12, 2015

(30) Foreign Application Priority Data

Jan. 15, 2013 (JP) ................................. 2013-004635

(51) Int. Cl.
*H01L 41/193* (2006.01)
*C08G 18/61* (2006.01)

(52) U.S. Cl.
CPC ............ *H01L 41/193* (2013.01); *C08G 18/61* (2013.01)

(58) Field of Classification Search
CPC .................................................... H01L 41/193
(Continued)

(56) References Cited

U.S. PATENT DOCUMENTS

2013/0307370 A1* 11/2013 Jenninger ............. H01L 41/113
310/300
2013/0338330 A1* 12/2013 Nakagawa ............ C07C 263/10
528/65

FOREIGN PATENT DOCUMENTS

JP    6-85338 A    3/1994
JP    6-85339 A    3/1994
(Continued)

OTHER PUBLICATIONS

Yamada, E., "Dynamic Viscoelastic Properties of Polyurethanes", Nippon Gomu Kyokaishi, The Society of Rubber Science and Technology, Japan, 2001, vol. 74, No. 6, pp. 230-236; with partial English translation; cited in Japanese Office Action dated Jul. 25, 2017.

(Continued)

*Primary Examiner* — Derek Rosenau
(74) *Attorney, Agent, or Firm* — Westerman, Hattori, Daniels & Adrian, LLP

(57) ABSTRACT

The present invention provides a polymeric actuator which has excellent flexibility and elongation rate; low temperature dependability of physical properties such as an elastic modulus and high dielectric breakdown strength, and which can drive in a low electric field. The present invention relates to a polymeric actuator, wherein the polymeric dielectric has a storage elastic modulus at 20° C. [E'(20° C.)] determined by a dynamic viscoelastic measurement at a frequency of 1 Hz of not more than 0.5 MPa,
a ratio [E'(−20° C.)/E'(20° C.)] of a storage elastic modulus at −20° C. [E'(−20° C.)] determined by a dynamic viscoelastic measurement at a frequency of 1 Hz to the [E'(20° C.)] of not more than 5.0, and
a ratio [E'(40° C.)/E'(20° C.)] of a storage elastic modulus at 40° C. [E'(40° C.)] determined by a dynamic vis- (Continued)

coelastic measurement at a frequency of 1 Hz to the [E'(20° C.)] of not less than 0.5.

2 Claims, 1 Drawing Sheet

(58) Field of Classification Search
USPC .......................................................... 310/800
See application file for complete search history.

(56) References Cited

FOREIGN PATENT DOCUMENTS

| JP | 2006-241195 A | 9/2006 |
| JP | 2008-231155 A | 10/2008 |
| JP | 2010-515808 A | 5/2010 |
| JP | 2010-219380 A | 9/2010 |
| JP | 2012-95527 A | 5/2012 |
| WO | 01/06579 A2 | 1/2001 |
| WO | 2008/088733 A2 | 7/2008 |

OTHER PUBLICATIONS

Office Action dated Jul. 25, 2017, issued in counterpart Japanese Application No. 2013-252927, with English Translation. (4 pages).
International Search Report dated Mar. 11, 2014 issued in corresponding application No. PCT/JP2013/082831 (2 pages).

* cited by examiner

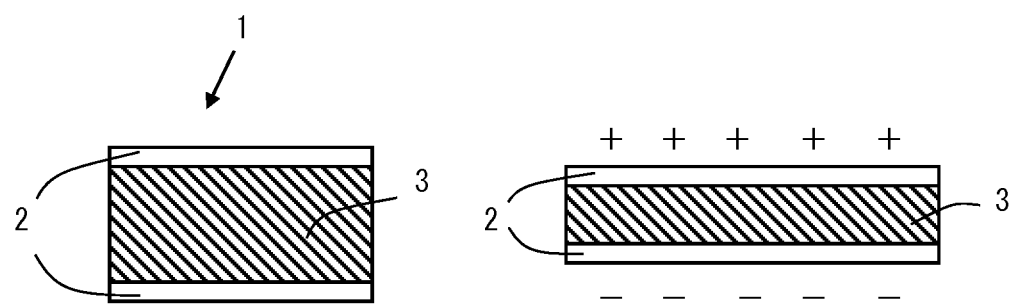

POLYMERIC ACTUATOR

TECHNICAL FIELD

The present invention relates to a polymeric actuator which has excellent flexibility and elongation rate; low temperature dependability of physical properties such as an elastic modulus and high dielectric breakdown strength, and which can drive in a low electric field.

BACKGROUND OF THE INVENTION

A polymeric actuator formed from a polymeric material, as compared with an actuator formed from materials such as a ceramic, a metal and the like, has features that it is lightweight and it has excellent flexibility. From these features, the polymeric actuator is collecting a lot of attention as an actuator, which is applicable to a sensor, an optical switch, a diaphragm, a Braille display, power generation applications such as wave power and heel power, industrial and nursing care robots, medical instruments and the like, and can safely operate if directly contacting with human skin. Various polymeric actuators, which are formed from an ion-exchange membrane, a conductive polymer, a dielectric elastomer, a polymer gel, a hydrogel, a carbon nanotube and the like, have been ever proposed.

However, since the actuator formed from the ion exchange membrane, the conductive polymer or the hydrogel is driven by movement of water or ions, it was difficult to drive the actuator in air. Therefore, a polymeric actuator formed from a dielectric elastomer, which it is unnecessary to use a solvent, was proposed. However, since a drive voltage for a deformation is high, which is several thousand V, in the polymeric actuator using the dielectric elastomer, it is required to further reduce the drive voltage for practical use.

Therefore, a polymeric actuator obtained by using a polyol, which is dielectric or has a substituent having relatively strong dipole moments, as a new polymeric material, for which the polymeric actuator can be driven in air, in elastomers such as a polyurethane elastomer or by adding a high dielectric constant solvent thereto has been proposed (Patent Documents 1 to 3).

Patent Document 1 discloses a polyurethane elastomer actuator, in which the polyol is oriented in the direction of an electric field by applying a DC electric field to a polyurethane elastomer which comprises a dielectric polyol or a polyol containing a substituent having relatively strong dipole moments. However, the polyurethane elastomer actuator has an improved flexibility and can drive in a low electric field by optimizing a molecular weight and the like of materials used, but a temperature dependability of physical properties is not described, and there is a problem that the dielectric breakdown strength is low because of high dielectric constant of the polyol.

Patent Document 2 discloses a high-speed response polyurethane gel actuator, in which dielectric molecules or substituents are oriented in the direction of an electric field and a structure of the gel is anisotropically changed by applying a DC electric field to a polyurethane gel-like material, which is formed by involving a dielectric solvent in a dielectric polyurethane elastomer or a polyurethane elastomer containing a substituent having relatively strong dipole moments. The polyurethane gel actuator has an improved flexibility and can drive in a low electric field by using a high dielectric constant solvent, but there is a problem that the dielectric breakdown strength is low because of using the solvent, which is a low molecular weight component.

Patent Document 3 discloses a dielectric film suitable for a transducer such as an actuator, a sensor and the like, which is formed by crosslinking an elastomer composition comprising an elastomer containing a heteroatom in a molecule and a high dielectric constant liquid compound containing a heteroatom in a molecule, which is compatible with the elastomer. The dielectric film has an improved flexibility and can drive in a low electric field by using a high dielectric constant solvent, but there is a problem that the dielectric breakdown strength is low because of using the solvent, which is a low molecular weight component.

Therefore, a polymeric actuator obtained by using a dielectric elastomer which has low temperature dependability of physical properties such as an elastic modulus and high dielectric breakdown strength, and which can drive in a low electric field is required.

PRIOR ART

Patent Documents

Patent Document 1: JP 6-85339 A
Patent Document 2: JP 6-85338 A
Patent Document 3: JP 2010-219380 A

OBJECTS OF THE INVENTION

The object of the present invention is to solve the above mentioned problems and to provide a polymeric actuator which has excellent flexibility and elongation rate; low temperature dependability of physical properties such as an elastic modulus and high dielectric breakdown strength, and which can drive in a low electric field.

The present inventors have intensely studied solutions for solving the above mentioned problems and have found that it is possible to provide a polymeric actuator which has excellent flexibility and elongation rate; low temperature dependability of physical properties such as an elastic modulus and high dielectric breakdown strength, and which can drive in a low electric field by adjusting:

a storage elastic modulus at 20° C. [E'(20° C.)] of a polymeric dielectric determined by a dynamic viscoelastic measurement at a frequency of 1 Hz;

a ratio [E'(−20° C.)/E'(20° C.)] of a storage elastic modulus at −20° C. [E'(−20° C.)] of the polymeric dielectric determined by a dynamic viscoelastic measurement at a frequency of 1 Hz to the [E'(20° C.)]; and a ratio [E'(40° C.)/E'(20° C.)] of a storage elastic modulus at 40° C. [E'(40° C.)] of the polymeric dielectric determined by a dynamic viscoelastic measurement at a frequency of 1 Hz to the [E'(20° C.)];

to specified ranges in the polymeric actuator comprising two electrodes and the polymeric dielectric disposed between the electrodes. The present invention has been completed based on the above finding.

SUMMARY OF THE INVENTION

The present invention relates to polymeric actuator comprising two electrodes and a polymeric dielectric disposed between the electrodes, wherein the polymeric dielectric has a storage elastic modulus at 20° C. [E'(20° C.)] determined by a dynamic viscoelastic measurement at a frequency of 1 Hz of not more than 0.5 MPa, a ratio [E'(−20° C.)/E'(20° C.)] of a storage elastic modulus at −20° C. [E'(−20° C.)] determined by a dynamic viscoelastic measurement at a frequency of 1 Hz to the [E'(20° C.)] of not more than 5.0, and a ratio [E'(40° C.)/E'(20° C.)] of a storage elastic modulus at 40° C. [E'(40° C.)] determined by a dynamic viscoelastic measurement at a frequency of 1 Hz to the [E'(20° C.)] of not less than 0.5.

In order to suitably carry out the present invention, it is desired that:

the polymeric dielectric is composed of a polyurethane elastomer molded article formed from a polyurethane elastomer composition comprising a polyisocyanate component, an active hydrogen component and a catalyst, and a reactive silicone having a number average molecular weight Mn of 500 to 7,000 is contained in an amount of 10 to 70% by mass, based on the total mass of the polyurethane elastomer composition; and the reactive silicone is a side-chain type reactive silicone.

Effects of the Invention

According to the present invention, it is possible to provide a polymeric actuator which has excellent flexibility and elongation rate; low temperature dependability of physical properties such as an elastic modulus and high dielectric breakdown strength, and which can drive in a low electric field by adjusting:

a storage elastic modulus at 20° C. [E'(20° C.)] of a polymeric dielectric determined by a dynamic viscoelastic measurement at a frequency of 1 Hz;

a ratio [E'(−20° C.)/E'(20° C.)] of a storage elastic modulus at −20° C. [E'(−20° C.)] of the polymeric dielectric determined by a dynamic viscoelastic measurement at a frequency of 1 Hz to the [E'(20° C.)]; and a ratio [E'(40° C.)/E'(20° C.)] of a storage elastic modulus at 40° C. [E'(40° C.)] of the polymeric dielectric determined by a dynamic viscoelastic measurement at a frequency of 1 Hz to the [E'(20° C.)];

to specified ranges in the polymeric actuator comprising two electrodes and the polymeric dielectric disposed between the electrodes.

BRIEF DESCRIPTION OF THE DRAWINGS

FIG. 1 is a schematic cross section illustrating the states before and after applying a voltage to a polymeric actuator.

DESCRIPTION OF THE PREFERRED EMBODIMENTS

An operating principle of a polymeric actuator will be described below with reference to FIG. 1. The left figure of FIG. 1 shows the polymeric actuator 1 before a voltage is applied thereon, in which the electrodes 2 are formed on both sides of the polyurethane elastomer molded article 3. As shown in the right figure of FIG. 1, since a positive charge and a negative charge in the both electrodes 2 are attracted each other when a voltage is applied to the electrodes 2, the polyurethane elastomer molded article 3 is compressed and the thickness is reduced, and the polyurethane elastomer molded article is elongated in a plane direction.

A generative force $P_z$ in a thickness direction and a generative force $P_{xy}$ in a plane direction as a force P generated at this time, and an elongation rate $S_z$ in a thickness direction and an elongation ratio $S_{xy}$ in a plane direction as an elongation rate S are represented by the following formulae.

|  | Thickness (z) direction | Plane (xy) direction |
| --- | --- | --- |
| Generative force (P) | $P_z = \epsilon_0 \epsilon_r E^2$ | $P_{xy} = \nu \epsilon_0 \epsilon_r E^2$ |
| Elongation rate (S) | $S_z = (\epsilon_0 \epsilon_r / Y) E^2$ | $S_{xy} = \nu (\epsilon_0 \epsilon_r / Y) E^2$ |

$\epsilon_0$: Dielectric constant of vacuum
$\epsilon_r$: Relative dielectric constant of polyurethane elastomer molded article
E: Electric field intensity
E = V/d (V: voltage, d: thickness)
$\nu$: Poisson's ratio
$\nu = S_{xy}/S_z = P_{xy}/P_z$
Y: Elastic modulus of polyurethane elastomer molded article Therefore, as is apparent from the formulae, it is shown that high relative dielectric constant and low elastic modulus of the polyurethane elastomer molded article and high electric field intensity E (=V/d) are required in order to accomplish high elongation rate S. It is necessary to reduce a drive voltage V in order to accomplish low-electric field driving as the object of the present invention.

In the polymeric actuator of the present invention, as described above, it is desired that the polymeric dielectric has:

(1) a storage elastic modulus at 20° C. [E'(20° C.)] determined by a dynamic viscoelastic measurement at a frequency of 1 Hz of not more than 0.5 MPa, preferably 0.01 to 0.45 MPa, more preferably 0.03 to 0.40 MPa, (2) a ratio [E'(−20° C.)/E'(20° C.)] of a storage elastic modulus at −20° C. [E'(−20° C.)] determined by a dynamic viscoelastic measurement at a frequency of 1 Hz to the [E'(20° C.)] of not more than 5.0, preferably not more than 4.5, and (3) a ratio [E'(40° C.)/E'(20° C.)] of a storage elastic modulus at 40° C. [E'(40° C.)] determined by a dynamic viscoelastic measurement at a frequency of 1 Hz to the [E'(20° C.)] of not less than 0.5, preferably not less than 0.55.

When the E'(20° C.) is higher than 0.5 MPa, the elastic modulus is high, and it is difficult to drive the polymeric actuator in a low electric field. When the ratio [E'(−20° C.)/E'(20° C.)] is larger than 5.0, characteristics change of the polymeric actuator is too large, and it is not suitable for using it, for example, as an artificial muscle. When the ratio [E'(40° C.)/E'(20° C.)] is smaller than 0.5, characteristics change of the polymeric actuator is too large, and it is not suitable for using it, for example, as an artificial muscle.

The storage elastic modulus (E') at each temperature is determined by measuring a storage elastic modulus (E') within a measuring temperature range of −100 to 50° C. using a dynamic viscoelasticity measuring device ("DMA861e" from Mettler-Toledo, Inc.) at a frequency of 1 Hz, a temperature elevation rate of 2.5° C./min and in a shear mode as a measuring condition, with a test specimen having a diameter of 10 mm and a thickness of 1 mm. The ratio is determined by calculating from values of the storage elastic modulus (E') at −20° C., 20° C. and 40° C.

In the polymeric actuator of the present invention, when the E'(20° C.) is lower than 0.5 MPa, it is possible to ensure the low elastic modulus in the above formulae, and it is possible to achieve a high elongation rate S. Furthermore, in the polymeric actuator of the present invention, the ratio [E'(−20° C.)/E'(20° C.)] is adjusted to not more than 5.0 and the ratio [E'(40° C.)/E'(20° C.)] is adjusted to not less than 0.5 in order to reduce the temperature dependability of the elastic modulus within an operating temperature range of the polymeric actuator of −20 to 40° C.

As described above, it is desired that the polymeric dielectric of the polymeric actuator of the present invention is composed of a polyurethane elastomer molded article obtained by reacting and curing a polyurethane elastomer composition (mixed solution) comprising a polyisocyanate component, an active hydrogen component and a catalyst. In addition, additives such as a pigment, a flame retardant, an anti-coloring agent and the like can be used therein.

Moreover, as the active hydrogen component of the polyurethane elastomer composition used in the polymeric actuator of the present invention, it is desired to use a reactive silicone. The reactive silicone has a functional group, such as an amino group, a hydroxyl group, a mercapto group, a carboxyl group, a silanol group and the like as a reactive group X, which can react with an isocyanate group. Examples of the reactive silicones include:

a main-chain type reactive silicone having a polydimethylsiloxane structure in a main chain represented by the following formula:

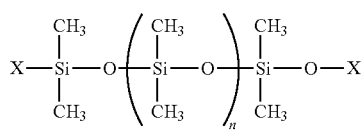

[Formula 1]

a side-chain type reactive silicone having a polydimethylsiloxane structure in a side chain represented by the following formula:

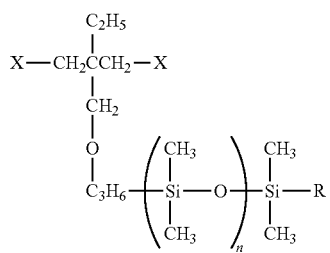

[Formula 2]

and the like.

It is desired that the reactive silicone has a number average molecular weight Mn of 500 to 7,000, preferably 700 to 6,000, more preferably 900 to 5,500. When the number average molecular weight Mn of the reactive silicone is lower than 500, a concentration of a hard segment is high, and an elastic modulus of the elastomer is high. On the other hand, when the number average molecular weight Mn is higher than 7,000, a reactivity of the reactive silicone is reduced, and thus it is difficult to produce the elastomer or a handleability thereof is reduced because an adhesion of the elastomer is high.

It is desired that the reactive silicone is contained in an amount of 10 to 70% by mass, preferably 12 to 65% by mass, more preferably 15 to 40% by mass, based on the total mass of the polyurethane elastomer composition. When the amount of the reactive silicone is smaller than 10% by mass, the temperature dependability is reduced and the dielectric breakdown strength is not improved. On the other hand, when the amount of the reactive silicone is higher than 70% by mass, it is difficult to drive the polymeric actuator in a low electric field. In addition, a side-chain type reactive silicone is preferred as the reactive silicone because of high molecular mobility of the polydimethylsiloxane chain.

Since a glass transition temperature of the polyurethane elastomer molded article is lowered by using a reactive silicone containing a polydimethylsiloxane structure having very low glass transition temperature of −110 to −120° C. for the molded article, a change of the elastic modulus is in a rubbery plateau area within an assumed operating temperature range of the polymeric actuator of −20 to 40° C., and it is considered that a temperature dependability of the elastic modulus is reduced.

In the polymeric actuator of the present invention, examples of commercially available products of the reactive silicone, which can be used as an active hydrogen component of the polyurethane elastomer composition, include "Silaplane FM-DA11", "Silaplane FM-DA21", "Silaplane FM-4411" and "Silaplane FM-4421", which are commercially available from JNC Corporation; "KF-6001", "KF-6002", "X-22-176DX", "X-22-4272" and "X-22-161A", which are commercially available from Shin-Etsu Chemical Co., Ltd.; "BY16-871" and "BY16-201", which are commercially available from Dow Corning Toray Co., Ltd.; and the like.

The isocyanate component used in the polyurethane elastomer composition of the present invention is not particularly limited, but compounds known in the field of polyurethane can be used. Examples of the isocyanate components include aromatic diisocyanates such as 2, 4-toluene diisocyanate, 2, 6-toluene diisocyanate, 2, 2'-diphenylmethane diisocyanate, 2, 4'-diphenylmethane diisocyanate, 4, 4'-diphenylmethane diisocyanate, 1,5-naphthalene diisocyanate, p-phenylene diisocyanate, m-phenylene diisocyanate, p-xylylene diisocyanate, and m-xylylene diisocyanate; aliphatic diisocyanates such as ethylene diisocyanate, 2, 2, 4-trimethyl hexamethylene diisocyanate, 1, 6-hexamethylene diisocyanate; cycloaliphatic diisocyanates such as 1, 4-cyclohexane diisocyanate, 4, 4'-dicyclohexylmethane diisocyanate, isophorone diisocyanate, norbornane diisocyanate; and the like. These isocyanate components may be used alone or in combination of two or more thereof. In addition, the isocyanate may be a urethane-modified, allophanate-modified, biuret-modified or isocyanurate-modified isocyanate. The isocyanates may be a prepolymer with a polyol.

Examples of commercially available products of the polyisocyanate component include "Cosmonate T-80" and "Cosmonate T-100", which are commercially available from Mitsui Chemicals, Inc.; "Lupranate T-80", which is commercially available from BASF Ionic Polyurethane Co., Ltd.; and the like.

An active hydrogen component other than the reactive silicone, which can be used in the present invention, is not particularly limited, but examples thereof include polymeric polyols such as polyester-based polyols, polyether-based polyols, polycarbonate-based polyols, polybutadiene-based polyols, castor oil-based polyols and the like, which can be suitably used. Furthermore, polyols may be used alone or in combination of two or more. As the active hydrogen component that can be used in the present invention, polyether-based polyols are preferable from the viewpoint of easily achieving a reduction of the elastic modulus. Also, when taking the polyether-based polyol as an example, trifunctional polyols are basically produced by an addition polymerization of ethylene oxide or propylene oxide with glycerin, trimethylolpropane and the like, which is a trivalent alcohol, as an initiator under the presence of a basic catalyst.

Examples of the polyether-based polyols include polytetramethylene glycol, polypropylene glycol, polyethylene glycol, a copolymer of propylene oxide and ethylene oxide, polyols containing polyacrylonitrile-based particles, polyols containing polystyrene particles (POP) and the like.

Examples of the polyester-based polyols include poly(ethylene adipate), poly(diethylene adipate), polypropylene adipate), poly(tetramethylene adipate), poly(hexamethylene adipate), poly(neopentylene adipate), a polyol formed from 3-methyl-1, 5-pentanediol and adipic acid, and copolymers thereof, or a copolymer formed from caprolactone polyol formed by a ring-opening polymerization of ε-caprolactone, a carboxylic acid component and a glycol component.

Examples of the polycarbonate-based polyols include poly(hexanediol carbonate), poly(nonanediol carbonate) and the like.

Examples of the polybutadiene-based polyols include terminal hydroxyl group-modified products of butadiene-based polymers selected from the group consisting of butadiene homopolymers, isoprene homopolymers, butadiene-styrene copolymer, butadiene-isoprene copolymer, butadiene-acrylonitrile copolymer, butadiene-2-ethylhexyl acrylate copolymer and butadiene-n-octadecyl acrylate copolymer.

Examples of the castor oil-based polyols include castor oil and modified castor oil (castor oil modified by polyhydric alcohols such as trimethylolpropane, etc.).

Examples of commercially available products of the active hydrogen component include "Excenol 1020", "Excenol 1030", "Excenol 2020", "Excenol 3 020", "Excenol 3030", "Preminol 7001", "Preminol 7012", "Preminol 4006" and "Preminol 4011", which are manufactured by Asahi Glass Co., Ltd.; Actcol "EP-901P", "EP-240" and "SHP-3900", which are manufactured by Mitsui Chemicals, Inc.; Sannix "PP-2000" and "PP-3000", which are manufactured by Sanyo Chemical Industries, Ltd. and the like.

Moreover, amine compounds such as polyether-based amines can also be used as the active hydrogen component. Examples of the commercially available products thereof include "JEFFAMINE D-400", "JEFFAMINE D-2000", "JEFFAMINE BA-509", which are manufactured by Huntsman Corporation, and the like.

Furthermore, it is desired that an equivalent ratio (NCO group/OH group) of an isocyanate group (NCO group) of the polyisocyanate component to an active hydrogen group of the active hydrogen component (for example, OH group) is within the range of 0.3 to 1.5, preferably 0.6 to 1.2. When the equivalent ratio (NCO group/OH group) is smaller than 0.3, it tends to be difficult to prepare the molded article. On the other hand, when the equivalent ratio (NCO group/OH group) is larger than 1.5, the elastic modulus of the molded article is high, and it is difficult to drive the polymeric actuator in a low electric field.

Examples of catalysts used in the polyurethane composition, which are not limited thereto and can include well known catalysts, include tertiary amine catalysts such as triethylene diamine, N, N, N', N'-tetramethylhexanediamine, bis(2-dimethylaminoethyl)ether and the like, and metal catalysts such as tin octoate, di-n-butyltin dilaurate, lead octoate and the like. These catalysts may be used alone or in combination of two or more thereof.

Examples of commercially available products of the catalysts include lead octoate, which is commercially available from Toei Chemical Industry Co., Ltd. under the trade name "Hexoate lead 24%", "TEDA-L33", which is commercially available from Tosoh Corporation, "NIAX CATALYST A1", which is commercially available from Momentive Performance Materials Inc., "KAOLIZER NO. 1", which is commercially available from Kao Corporation, "DABCO T-9", which is commercially available from Air Products and Chemicals, Inc., "BTT-24", which is commercially available from Toei Chemical Industry Co. Ltd. and the like.

Method of producing the polyurethane elastomer molded article of the present invention may include a method conducted by using a mold, and when the thickness is small, a method comprising the steps of disposing a polyurethane elastomer composition between release-treated films with a spacer and then passing it through a nip roll, of which a clearance is controlled such that a desired thickness is obtained. As a curing condition of the molded article, it is desired that a curing temperature is within the range of 70 to 150° C., preferably 80 to 130° C. and a curing time is within the range of 1 to 24 hours. When the curing temperature is lower than 70° C., a hardenability of the polyurethane elastomer molded article is insufficient. On the other hand, when the curing temperature is higher than 150° C., a large amount of by-products is produced. Also, when the curing time of the molded article is less than 1 hour, a hardenability of the polyurethane elastomer molded article is insufficient. On the other hand, when the curing time is more than 24 hours, there is a case that the polyurethane elastomer molded article is deteriorated.

The resulting polyurethane elastomer molded article may be formed into a desired shape, such as a thin film, a film, a sheet and the like, and it is desired that it has a thickness of 0.01 to 1.2 mm, preferably 0.05 to 1.0 mm. When the thickness of the molded article is smaller than 0.01 mm, a dielectric breakdown is easily caused through defects in the film. On the other hand, when the thickness of the molded article is larger than 1.2 mm, an electric field intensity applied is low, and it is difficult to drive the actuator.

The polymeric actuator can be prepared by forming electrodes on both surfaces of the molded article. Examples of materials of the electrode include, for example, metals such as gold, platinum, aluminum, silver, copper and the like; carbon, carbon nanotubes; or a conductive resin or a conductive elastomer, in which the above materials are dispersed in a resin. As a method for forming the electrode, for example, a plasma CVD method, an ion sputtering coating method, a vacuum deposition method, a screen printing can be used.

The polymeric actuator of the present invention is not only applicable to purposes as an actuator, such as industrial and nursing care robots, medical instruments and the like as described above, but also it is applicable to purposes as a sensor, in which voltage change is detected from a deformation thereof.

EXAMPLES

The following Examples and Comparative Examples further illustrate the present invention in detail, but are not to be construed to limit the scope of the present invention.

Example 1

In the reaction vessel, 41.4 parts by mass of a side-chain type reactive silicone ("Silaplane FM-DA11" manufactured by JNC Corporation, number average molecular weight Mn of 1,000, functional group number of 2) and 41.4 parts by mass of polypropylene glycol ("Excenol 7001" manufactured by Asahi Glass Co., Ltd., a number average molecular weight 6000, functional group number of 3) were put, and dehydrated under reduced pressure for 1 hour while stirring. The inside of the reaction vessel was then purged with nitrogen gas. To the reaction vessel, 17.8 parts by mass of tolylene diisocyanate ("T-100" manufactured by Mitsui Chemicals, Inc., 2, 4-tolylene diisocyanate=100) was added, and then was reacted for 3 hours while the temperature in the reaction vessel was maintained at 80° C. to synthesize an isocyanate-terminated polyurethane prepolymer.

Next, 100 parts by mass of the prepolymer was dissolved in 65 parts by mass of toluene. To prepolymer solution, a mixed solution of 51.4 parts by mass of polypropylene glycol ("Excenol 1020" manufactured by Asahi Glass Co., Ltd., a number average molecular weight 1000, functional group number of 2) and 0.19 parts by mass of lead octoate ("Hexoate lead 24%" manufactured by Toei Chemical Industry Co., Ltd.) was added, and then were mixed and defoamed in a hybrid mixer (manufactured by Keyence Corporation) to obtain a reaction solution. The reaction solution was dropped on a release-treated polyethylene terephthalate film with a 0.4 mm spacer and another release-treated polyethylene terephthalate film was covered thereon, and then adjusting a thickness thereof to 0.4 mm due to a nip roll. A polyurethane elastomer film was then prepared by curing it at 80° C. for 1 hour.

With respect to the prepared film, 100% of a biaxial orientation process was conducted, and it was fixed to a polypropylene frame having a diameter of 60 mm. An actuator element was prepared by coating a carbon grease on the fixed film so that the coated diameter is 15 mm.

Example 2

A polyurethane elastomer film actuator was prepared as described in Example 1 except that as the polyol mixed solution when preparing the isocyanate-terminated prepolymer, 18.2 parts by mass of the side-chain type reactive silicone ("Silaplane FM-DA11" manufactured by JNC Corporation, number average molecular weight Mn of 1,000, functional group number of 2), 22.9 parts by mass of polypropylene glycol ("Excenol 1020" manufactured by Asahi Glass Co., Ltd., a number average molecular weight 1000, functional group number of 2) and 41.4 parts by mass of polypropylene glycol ("Excenol 7001" manufactured by Asahi Glass Co., Ltd., a number average molecular weight 6000, functional group number of 3) were used.

Example 3

A polyurethane elastomer film actuator was prepared as described in Example 1 except that a curing agent when preparing the polyurethane elastomer film was 51.4 parts by mass of the side-chain type reactive silicone ("Silaplane FM-DA11" manufactured by JNC Corporation, number average molecular weight Mn of 1,000, functional group number of 2).

Example 4

A polyurethane elastomer film actuator was prepared as described in Example 1 except that as a curing agent when preparing the polyurethane elastomer film, 64.3 parts by mass of the side-chain type reactive silicone ("Silaplane FM-DA11" manufactured by JNC Corporation, number average molecular weight Mn of 1,000, functional group number of 2), 0.21 parts by mass of lead octoate and 70.5 parts by mass of toluene were used.

Example 5

A polyurethane elastomer film actuator was prepared as described in Example 1 except that:

as the polyol mixed solution when preparing the isocyanate-terminated prepolymer, 41.1 parts by mass of polypropylene glycol ("Excenol 1020" manufactured by Asahi Glass Co., Ltd., a number average molecular weight 1000, functional group number of 2) and 41.4 parts by mass of polypropylene glycol ("Excenol 7001" manufactured by Asahi Glass Co., Ltd., a number average molecular weight 6000, functional group number of 3) were used, and as a curing agent when preparing the polyurethane elastomer film, 41.0 parts by mass of polypropylene glycol ("Excenol 1020" manufactured by Asahi Glass Co., Ltd., a number average molecular weight 1000, functional group number of 2), 52.1 parts by mass of the side-chain type reactive silicone ("Silaplane FM-DA21" manufactured by JNC Corporation, number average molecular weight Mn of 5,000, functional group number of 2), 0.27 parts by mass of lead octoate and 92.9 parts by mass of toluene were used.

Example 6

A polyurethane elastomer film actuator was prepared as described in Example 1 except that as the polyol mixed solution when preparing the isocyanate-terminated prepolymer, 41.4 parts by mass of a main-chain type reactive silicone ("Silaplane FM-4411" manufactured by JNC Corporation, number average molecular weight Mn of 1,000, functional group number of 2) and 41.1 parts by mass of polypropylene glycol ("Preminol 7001" manufactured by Asahi Glass Co., Ltd., a number average molecular weight 6000, functional group number of 3) were used.

Example 7

A polyurethane elastomer film actuator was prepared as described in Example 5 except that as a curing agent when preparing the polyurethane elastomer film, 41.0 parts by mass of polypropylene glycol ("Excenol 1020" manufactured by Asahi Glass Co., Ltd., a number average molecular weight 1000, functional group number of 2) and 52.1 parts by mass of the main-chain type reactive silicone ("Silaplane FM-4411" manufactured by JNC Corporation, number average molecular weight Mn of 5,000, functional group number of 2) were used.

Comparative Example 1

A polyurethane elastomer film actuator was prepared as described in Example 1 except that as the polyol mixed solution when preparing the isocyanate-terminated prepolymer, 41.1 parts by mass of polypropylene glycol ("Excenol 1020" manufactured by Asahi Glass Co., Ltd., a number average molecular weight 1000, functional group number of 2) and 41.1 parts by mass of polypropylene glycol ("Preminol 7001" manufactured by Asahi Glass Co., Ltd., a number average molecular weight 6000, functional group number of 3) were used.

Comparative Example 2

A polyurethane elastomer film actuator was prepared as described in Comparative Example 1 except that as a curing agent when preparing the polyurethane elastomer film, 205.2 parts by mass of polypropylene glycol ("Preminol 7001" manufactured by Asahi Glass Co., Ltd., a number average molecular weight 6000, functional group number of 3), 0.38 parts by mass of lead octoate and 712.1 parts by mass of dioctyl phthalate (DOP manufactured by Sankyo Chemical Co., Ltd.) were used and toluene was not used.

Comparative Example 3

A polyurethane elastomer film actuator was prepared as described in Comparative Example 1 except that as the polyol mixed solution when preparing the isocyanate-terminated prepolymer, 10.6 parts by mass of the side-chain type reactive silicone ("Silaplane FM-DA11" manufactured by JNC Corporation, number average molecular weight Mn of 1,000, functional group number of 2), 30.5 parts by mass of polypropylene glycol ("Excenol 1020" manufactured by Asahi Glass Co., Ltd., a number average molecular weight 1000, functional group number of 2) and 41.1 parts by mass of polypropylene glycol ("Preminol 7001" manufactured by Asahi Glass Co., Ltd., a number average molecular weight 6000, functional group number of 3) were used.

Comparative Example 4

A polyurethane elastomer film actuator was prepared as described in Example 1 except that:
as the polyol mixed solution when preparing the isocyanate-terminated prepolymer, 58.5 parts by mass of the side-chain type reactive silicone ("Silaplane FM-DA11" manufactured by JNC Corporation, number average molecular weight Mn of 1,000, functional group number of 2) and 19.5 parts by mass of polypropylene glycol ("Preminol 7001" manufactured by Asahi Glass Co., Ltd., a number average molecular weight 6000, functional group number of 3) were used, and
as a curing agent when preparing the polyurethane elastomer film, 63.3 parts by mass of the side-chain type reactive silicone ("Silaplane FM-DA11" manufactured by JNC Corporation, number average molecular weight Mn of 1,000, functional group number of 2), 0.20 parts by mass of lead octoate and 70.1 parts by mass of toluene were used.

Comparative Example 5

A polyurethane elastomer film actuator was prepared as described in Example 5 except that as a curing agent when preparing the polyurethane elastomer film, 48.2 parts by mass of polypropylene glycol ("Excenol 1020" manufactured by Asahi Glass Co., Ltd., a number average molecular weight 1000, functional group number of 2), 48.2 parts by mass of a side-chain type reactive silicone ("Silaplane FM-DA26" manufactured by JNC Corporation, number average molecular weight Mn of 15,000, functional group number of 2), 0.25 parts by mass of lead octoate and 84.1 parts by mass of toluene were used.

Comparative Example 6

A polyurethane elastomer film actuator was prepared as described in Example 5 except that as a curing agent when preparing the polyurethane elastomer film, 46.7 parts by mass of polypropylene glycol ("Excenol 1020" manufactured by Asahi Glass Co., Ltd., a number average molecular weight 1000, functional group number of 2), 46.7 parts by mass of a main-chain type reactive silicone ("Silaplane FM-4425" manufactured by JNC Corporation, number average molecular weight Mn of 10,000, functional group number of 2), 0.24 parts by mass of lead octoate and 82.9 parts by mass of toluene were used. However, it was not possible to obtain a film.

The prepolymer formulations of Examples 1 to 7, the prepolymer formulations of Comparative Examples 1 to 6, the elastomer formulation of Examples 1 to 7 and the elastomer formulation of Comparative Examples 1 to 6 were shown in Table 1 to Table 4 in an unit of parts by mass, respectively. With respect to the resulting polyurethane elastomer film actuators as described above, a storage elastic modulus at 20° C. [E'(20° C.)], a ratio [E'(−20° C.)/E'(20° C.)] of a storage elastic modulus at −20° C. [E'(−20° C.)] to the [E'(20° C.)], a ratio [E'(40° C.)/E'(20° C.)] of a storage elastic modulus at 40° C. [E'(40° C.)] to the [E'(20° C.)], an elongation rate and a dielectric breakdown strength were measured. The results thereof are shown in Table 5 and Table 6. The test methods are as follows.

(Test Method)
(1) Dynamic Viscoelasticity Measurement

A storage elastic modulus (E') was measured using a dynamic viscoelasticity measuring device ("DMA861e" from Mettler-Toledo, Inc.) at the following conditions:
a frequency: 1 Hz
a temperature elevation rate: 2.5° C./min
a measuring temperature range: −100 to 50° C.
a measurement mode: a shear mode
a sample shape: a diameter of 10 mm, a thickness of 1 mm.

The values of the storage elastic modulus at 20° C. [E'(20° C.)], the ratio [E'(−20° C.)/E'(20° C.)] of the storage elastic modulus at −20° C. [E'(−20° C.)] to the [E'(20° C.)] and the ratio [E'(40° C.)/E'(20° C.)] of the storage elastic modulus at 40° C. [E'(40° C.)] to the [E'(20° C.)] are shown in Table 5 to Table 6.

(2) Elongation Rate and Dielectric Breakdown Strength

The produced actuator elements are connected to a DC high voltage power supply ("HJPM-5R0.6-SP" manufactured by Matsusada Precision Inc.) via a copper foil and a change in an elongation rate with respect to the applied voltage was measured. The values in an electric field intensity of 10 MV/m are shown in Table 5 and Table 6. In addition, an electric field intensity when the actuator element is short-circuited in the test is shown as a dielectric breakdown strength. An elongation rate was determined from the following equation.

$$\text{Elongation rate (\%)} = [\sqrt{(S_2/S_1 - 1)}] \times 100$$

$S_1$: Film area before elongating
$S_2$: Film area after applying a voltage

TABLE 1

| Prepolymer formulation | Example | | | | | | |
|---|---|---|---|---|---|---|---|
| | 1 | 2 | 3 | 4 | 5 | 6 | 7 |
| Isocyanate component | | | | | | | |
| T-100 *1 | 17.8 | 17.8 | 17.8 | 17.8 | 17.8 | 17.8 | 17.8 |
| Polyol component | | | | | | | |
| Excenol 1020 *2 | — | 22.9 | — | — | 41.1 | — | 41.1 |
| Preminol 7001 *3 | 41.1 | 41.1 | 41.1 | 41.1 | 41.1 | 41.1 | 41.1 |
| FM-DA11 *4 | 41.1 | 18.2 | 41.1 | 41.1 | — | — | — |
| FM-4411 *5 | — | — | — | — | — | 41.1 | — |
| NCO (%) | 4.31 | 4.31 | 4.31 | 4.31 | 4.31 | 4.31 | 4.31 |

TABLE 2

| Prepolymer formulation | Comparative Example | | | | | |
|---|---|---|---|---|---|---|
| | 1 | 2 | 3 | 4 | 5 | 6 |
| Isocyanate component | | | | | | |
| T-100 *1 | 17.8 | 17.8 | 17.8 | 17.8 | 17.8 | 17.8 |
| Polyol component | | | | | | |
| Excenol 1020 *2 | 41.1 | 41.1 | 30.5 | — | 41.1 | 41.1 |
| Preminol 7001 *3 | 41.1 | 41.1 | 41.1 | 19.5 | 41.1 | 41.1 |
| FM-DA11 *4 | — | — | 10.6 | 58.5 | — | — |
| FM-4411 *5 | — | — | — | — | — | — |
| NCO (%) | 4.31 | 4.31 | 4.31 | 5.32 | 4.31 | 4.31 |

TABLE 3

| Elastomer formulation | Example | | | | | | |
|---|---|---|---|---|---|---|---|
| | 1 | 2 | 3 | 4 | 5 | 6 | 7 |
| Prepolymer *1 | 100 | 100 | 100 | 100 | 100 | 100 | 100 |
| Curing agent | | | | | | | |
| Excenol 1020 *2 | 51.4 | 51.4 | — | — | — | 41.0 | 51.4 | 41.0 |
| Preminol 7001 *3 | — | — | — | — | — | — | — |
| FM-DA11 *4 | — | — | 51.4 | 64.3 | — | — | — |
| FM-DA21 *6 | — | — | — | — | 52.1 | — | — |
| FM-DA26 *7 | — | — | — | — | — | — | — |
| FM-4421 *8 | — | — | — | — | — | — | 52.1 |
| FM-4425 *9 | — | — | — | — | — | — | — |
| Catalyst | | | | | | | |
| Lead octoate *10 | 0.19 | 0.19 | 0.19 | 0.21 | 0.27 | 0.19 | 0.27 |
| Plasticizer | | | | | | | |
| Dioctyl phthalate *11 | — | — | — | — | — | — | — |
| Solvent | | | | | | | |
| Toluene | 65.0 | 65.0 | 65.0 | 70.5 | 92.9 | 65.0 | 92.9 |
| NCO index *12 | 1.00 | 1.00 | 1.00 | 0.80 | 1.00 | 1.00 | 1.00 |

TABLE 4

| Elastomer formulation | Comparative Example | | | | | |
|---|---|---|---|---|---|---|
| | 1 | 2 | 3 | 4 | 5 | 6 |
| Prepolymer *1 | 100 | 100 | 100 | 100 | 100 | 100 |
| Curing agent | | | | | | |
| Excenol 1020 *2 | 51.4 | — | 51.4 | — | 48.2 | 46.7 |
| Preminol 7001 *3 | — | 205.2 | — | — | — | — |
| FM-DA11 *4 | — | — | — | 63.3 | — | — |
| FM-DA21 *6 | — | — | — | — | — | — |
| FM-DA26 *7 | — | — | — | — | 48.2 | — |
| FM-4421 *8 | — | — | — | — | — | — |
| FM-4425 *9 | — | — | — | — | — | 46.7 |
| Catalyst | | | | | | |
| Lead octoate *10 | 10.19 | 0.38 | 0.19 | 0.20 | 0.25 | 0.24 |
| Plasticizer | | | | | | |
| Dioctyl phthalate *11 | — | 712.1 | — | — | — | — |
| Solvent | | | | | | |
| Toluene | 65.0 | — | 65.0 | 70.1 | 84.1 | 82.9 |
| NCO index *12 | 1.00 | 1.00 | 1.00 | 1.00 | 1.00 | 1.00 |

(*1): 2, 4-tolylene diisocyanate, which is commercially available from Mitsui Chemicals, Inc. under the trade name of "Cosmonate T-100"

(*2) Bifunctional polyether polyol, which is commercially available from Asahi Glass Co., Ltd. under the trade name "Excenol 1020" (number average molecular weight Mn: 1,000)

(*3): Trifunctional polyether polyol, which is commercially available from Asahi Glass Co., Ltd. under the trade name "Preminol 7001" (number average molecular weight Mn: 6,000)

(*4) Side-chain type bifunctional reactive silicone, which is commercially available from JNC Corporation under the trade name "FM-DA11" (number average molecular weight Mn: 1,000)

(*5) Main-chain type bifunctional reactive silicone, which is commercially available from JNC Corporation under the trade name "FM-4411" (number average molecular weight Mn: 1,000)

(*6) Side-chain type bifunctional reactive silicone, which is commercially available from JNC Corporation under the trade name "FM-DA21" (number average molecular weight Mn: 5,000)

(*7) Side-chain type bifunctional reactive silicone, which is commercially available from JNC Corporation under the trade name "FM-DA26" (number average molecular weight Mn: 15,000)

(*8) Main-chain type bifunctional reactive silicone, which is commercially available from JNC Corporation under the trade name "FM-4421" (number average molecular weight Mn: 5,000)

(*9) Main-chain type bifunctional reactive silicone, which is commercially available from JNC Corporation under the trade name "FM-4425" (number average molecular weight Mn: 10,000)

(*10): Lead octoate, which is commercially available from Toei Chemical Industry Co., Ltd. under the trade name "Hexoate lead 24%"

(*11): Dioctyl phthalate, which is commercially available from Sankyo Chemical Co., Ltd. under the trade name "DOP"

(*12): NCO index: (number of equivalent of NCO group)/(number of equivalent of active hydrogen group)

TABLE 5

| Elastomer formulation | Example | | | | | | |
|---|---|---|---|---|---|---|---|
| | 1 | 2 | 3 | 4 | 5 | 6 | 7 |
| Introduced amount of reactive silicone (% by mass) | 27 | 12 | 61 | 64 | 27 | 27 | 27 |
| Type of reactive silicone | Side chain | Side chain | Side chain | Side chain | Side chain | Main chain | Main chain |
| E' (20° C.) (M · Pa) | 0.28 | 0.21 | 0.42 | 0.22 | 0.26 | 0.37 | 0.25 |
| E' (−20° C.)/E' (20° C.) | 4.01 | 4.92 | 1.85 | 2.36 | 3.84 | 4.47 | 3.95 |
| E' (40° C.)/E' (20° C.) | 0.73 | 0.53 | 0.80 | 0.76 | 0.74 | 0.65 | 0.73 |
| Dielectric breakdown strength [MV/m] | 38.4 | 28.3 | 75.8 | 40.3 | 35.6 | 31.0 | 32.6 |
| Elongation rate (10 MV/m) [%] | 4.5 | 6.4 | 1.8 | 2.8 | 4.2 | 5.2 | 4.3 |

TABLE 6

| Elastomer formulation | Comparative Example | | | | | |
|---|---|---|---|---|---|---|
| | 1 | 2 | 3 | 4 | 5 | 6 |
| Introduced amount of reactive silicone | 0 | 0 | 7 | 75 | 25 | 24 |
| Type of reactive silicone | — | — | Side chain | Side chain | Side chain | Main chain |
| E' (20° C.) (M · Pa) | 0.14 | 0.08 | 0.21 | 0.52 | * | * |
| E' (−20° C.)/E' (20° C.) | 6.25 | 5.89 | 5.67 | 1.63 | | |
| E' (40° C.)/E' (20° C.) | 0.45 | 0.48 | 0.49 | 0.85 | | |
| Dielectric breakdown strength [MV/m] | 11.3 | 7.8 | 17.5 | 78.2 | | |
| Elongation rate (10 MV/m) [%] | 8.3 | ** | 6.9 | 0.0 | | |

*: Since the elastomer was not cured, the test specimen cannot be prepared, and the measurement cannot be conducted.
**: Dielectric breakdown w* as caused.

As is apparent from the results shown in Table 5 and Table 6, the polymeric actuators of Examples 1 to 7 of the present invention have low temperature dependability of physical properties such as an elastic modulus, and very high elongation rate and dielectric breakdown strength as compared with the conventional polymeric actuators of Comparative Examples 1 to 6.

On the other hand, since the polymeric actuators of Comparative Examples 1 and 2 contain no reactive silicone, the ratio [E'(−20° C.)/E'(20° C.)] is large and the ratio [E'(40° C.)/E'(20° C.)] is small, and the temperature dependability is high and the dielectric breakdown strength is very low. In polymeric actuator of Comparative Example 2, the dielectric breakdown was caused at an electric field intensity smaller than 10 MV/m, and the elongation rate cannot be sufficiently obtained.

In the polymeric actuator of Comparative Example 3, since the amount of the reactive silicone is small, the ratio [E'(−20° C.)/E'(20° C.)] is large and the ratio [E'(40° C.)/E'(20° C.)] is small, and the temperature dependability is high and the dielectric breakdown strength is very low.

In the polymeric actuator of Comparative Example 4, since the amount of the reactive silicone is large, the temperature dependability and the dielectric breakdown strength are effectively improved, but the polymeric actuator does not drive at an electric field intensity of 10 MV/m and has an elongation ratio of 0.

In the polymeric actuators of Comparative Examples 5 and 6, since the number average molecular weight (Mn) of the reactive silicone used during curing is high, the reactivity thereof is very low, and it is difficult to prepare an elastomeric molded article. Therefore, the measurement and evaluation of properties cannot be conducted.

INDUSTRIAL APPLICABILITY

Since the polymeric actuator of the present invention has excellent flexibility and elongation rate and high dielectric breakdown strength, and can drive in a low electric field, it is applicable to a sensor, an optical switch, a diaphragm, a Braille display, power generation applications such as wave power and heel power, industrial and nursing care robots, medical instruments and the like.

DESCRIPTION OF REFERENCE NUMERALS

1: Polymeric actuator
2: Electrode
3: Polyurethane elastomer molded article

What is claimed is:

1. A polymeric actuator comprising two electrodes and a polymeric dielectric disposed between the electrodes,
   wherein the polymeric dielectric has a storage elastic modulus at 20° C. [E'(20° C.)] determined by a dynamic viscoelastic measurement at a frequency of 1 Hz of not more than 0.5 MPa,
   a ratio [E'(−20° C.)/E'(20° C.)] of a storage elastic modulus at −20° C. [E'(−20° C.)] determined by a dynamic viscoelastic measurement at a frequency of 1 Hz to the [E'(20° C.)] of not more than 5.0, and
   a ratio [E'(40° C.)/E'(20° C.)] of a storage elastic modulus at 40° C. [E'(40° C.)] determined by a dynamic viscoelastic measurement at a frequency of 1 Hz to the [E'(20° C.)] of not less than 0.5,
   wherein the polymeric dielectric is composed of a polyurethane elastomer molded article formed from a polyurethane elastomer composition comprising a polyisocyanate component, an active hydrogen component and a catalyst, and a reactive silicone having a number average molecular weight Mn of 500 to 7,000 is contained in an amount of 10 to 70% by mass, based on the total mass of the polyurethane elastomer composition.

2. The polymeric actuator according to claim 1, wherein the reactive silicone is a side-chain type reactive silicone.

* * * * *